United States Patent
Lavoie et al.

(10) Patent No.: US 11,092,632 B2
(45) Date of Patent: Aug. 17, 2021

(54) RESISTANCE-MEASURING DEVICE AND METHOD

(71) Applicant: HYDRO-QUÉBEC, Montréal (CA)

(72) Inventors: Samuel Lavoie, Ste-Julie (CA); Ghislain Lambert, Saint-Mathieu-de-Beloeil (CA)

(73) Assignee: HYDRO-QUEBEC, Montreal (CA)

( * ) Notice: Subject to any disclaimer, the term of this patent is extended or adjusted under 35 U.S.C. 154(b) by 89 days.

(21) Appl. No.: 16/334,975

(22) PCT Filed: Sep. 29, 2017

(86) PCT No.: PCT/CA2017/051157
§ 371 (c)(1),
(2) Date: Mar. 20, 2019

(87) PCT Pub. No.: WO2018/064754
PCT Pub. Date: Apr. 12, 2018

(65) Prior Publication Data
US 2019/0277896 A1    Sep. 12, 2019

Related U.S. Application Data

(60) Provisional application No. 62/404,376, filed on Oct. 5, 2016.

(51) Int. Cl.
*G01R 27/16* (2006.01)
*G01R 19/25* (2006.01)
*H02G 1/02* (2006.01)

(52) U.S. Cl.
CPC ......... *G01R 27/16* (2013.01); *G01R 19/2513* (2013.01); *H02G 1/02* (2013.01)

(58) Field of Classification Search
CPC ....... G01R 27/16; G01R 19/2513; H02G 1/02
(Continued)

(56) References Cited

U.S. PATENT DOCUMENTS

| 5,017,739 A | 5/1991 | Hoffman |
| 5,057,769 A | 10/1991 | Edwards |

(Continued)

FOREIGN PATENT DOCUMENTS

| CA | 2145336 C | 6/1998 |
| CA | 2377562 A1 | 1/2001 |

(Continued)

OTHER PUBLICATIONS

Radio Ohmstick Operators Manual: Radio Linked Micro Ohmmeter, Sensorlink Corporation, Aug. 31, 2012 (Aug. 31, 2012), accessed on Dec. 13, 2017 ( Dec. 13, 2017).

(Continued)

*Primary Examiner* — Tung X Nguyen
*Assistant Examiner* — Robert P Alejnikov, Jr.
(74) *Attorney, Agent, or Firm* — Norton Rose Fulbright Canada LLP

(57) ABSTRACT

A resistance-measuring device mountable to a component of a current-carrying transmission line. The device includes a body having a base and two arms with interconnected first ends and spaced-apart second ends. The arms define a gap therebetween. Each arm has an inner portion facing the gap. The body is displaceable to mount the body about the component and position the component within the gap. The body has an abrading mechanism mounted to the arms. The abrading mechanism has an electrically-conductive abrading element disposed along the arm and facing inwardly toward the gap. The abrading element rubs against an outer surface of the component upon displacing the body to mount the body about the component. A method is also disclosed.

20 Claims, 9 Drawing Sheets

(58) Field of Classification Search
USPC ............................ 324/525, 126, 543, 758.04
See application file for complete search history.

(56) References Cited

U.S. PATENT DOCUMENTS

| | | | |
|---|---|---|---|
| 5,126,680 | A | 6/1992 | Morin et al. |
| 5,130,642 | A | 7/1992 | Hoffman |
| 5,291,124 | A | 3/1994 | Hoffman |
| 5,663,718 | A | 9/1997 | Segerstrom |
| 6,124,714 | A | 9/2000 | McNulty |
| 6,130,530 | A | 10/2000 | McNulty |
| D439,537 | S | 3/2001 | Ternovits |
| 6,323,638 | B2 | 11/2001 | McNulty |
| 6,329,924 | B1 | 12/2001 | McNulty |
| 6,879,163 | B2 | 4/2005 | Ormin |
| D510,882 | S | 10/2005 | Buchanan |
| 6,998,832 | B1 | 2/2006 | McNulty |
| 7,746,051 | B1 | 6/2010 | Buchanan |
| D622,956 | S | 9/2010 | Hoffman |
| D664,457 | S | 7/2012 | Buchanan |
| 8,212,549 | B2 | 7/2012 | McNulty et al. |
| 8,233,301 | B1 | 7/2012 | Guo |
| 9,010,988 | B2 | 4/2015 | Springer III |
| D737,160 | S | 8/2015 | Garner et al. |
| 9,265,331 | B1 | 2/2016 | Hoffman |
| 2001/0004651 | A | 1/2001 | Ormin |
| 2002/0057090 | A1 | 5/2002 | Ormin |
| 2004/0075440 | A9 | 4/2004 | Ormin |
| 2005/0200369 | A1 | 9/2005 | Langevin |
| 2006/0284647 | A1* | 12/2006 | Gunn .................. G01R 15/183 324/126 |
| 2008/0003849 | A1* | 1/2008 | Cherian ............... H05K 7/1069 439/82 |
| 2011/0101716 | A1* | 5/2011 | Nolte ...................... H02G 1/02 294/174 |
| 2012/0175575 | A1* | 7/2012 | Devine .................... H02G 1/02 254/134.3 PA |
| 2014/0072950 | A1 | 3/2014 | Fu |
| 2015/0091735 | A1 | 4/2015 | McNulty |
| 2016/0041208 | A1 | 2/2016 | Hoffman |
| 2016/0111860 | A1* | 4/2016 | Liu ............................ B25J 5/00 29/745 |
| 2018/0006437 | A1* | 1/2018 | Frenken ............... B23D 29/023 |
| 2021/0069870 | A1* | 3/2021 | Kwon ...................... B25B 9/00 |

FOREIGN PATENT DOCUMENTS

| | | |
|---|---|---|
| EP | 1296150 A1 | 3/2003 |
| EP | 725935 B1 | 1/2005 |
| EP | 1194786 B1 | 12/2005 |
| WO | 1994004936 A1 | 3/1994 |
| WO | 2010096344 A1 | 8/2010 |
| WO | 2012151836 A1 | 11/2012 |
| WO | 2015051039 A1 | 4/2015 |

OTHER PUBLICATIONS

International Search Report dated Jan. 4, 2018.
Radio Ohmstik Radio Linked Live-Line Micro Ohmmeter, SenorLink Corporation, Jun. 30, 2015 (Jun. 30, 2015), accessed on Dec. 13, 2017 ( Dec. 13, 2017).
"Georgia Tech Research Corporation; Patent Issued for Overhead Power Connector Integrity Assessment by Application of Thermal History Detectors", Journal of Engineering, NewsRx, 2015. URL : http://search.proquest.com/science/docview/1676428529/fulltext/D9D76950E5054A26PQ/1?accountid=27498.
"Logmaster LM-RA1000", site web Broy Engineering. URL : http://www.broy.com/product_main_lmra1000.html.
J. Snell, J. Renowden, "Improving results of thermographic inspections of electrical transmission and distribution lines," Proc. of the 2000 IEEE 9th International Conference on Transmission and Distribution Construction Operation and Live-Line Maintenance (2000 IEEE ESMO), Montréal, Québec, pp. 135-144, 2000. URL : http://ieeexplore.ieee.org/xpl/articleDetails.jsp?reload=true&arnumber=882811.
"Ohmstik PLUS Live-Line Micro Ohmmeter", Technical Sheet, SensorLink®. URL : http://www.sensorlink.com/images/stories/Ohmstik/PDFs/ohmstik plus datasheet v01.pdf.
"Amcorder ", Technical Sheet, SensorLink®. URL : http://www.sensorlink.com/images/stories/Amcorder/PDFs/amcorder datasheet v02.pdf.
P. Penserini, M. Le Huerou and L. Ecochard, "Live working diagnosis of joints of overhead lines," 12th International Conference on Electricity Distribution (CIRED), vol. 3, pp. 3.3.1-3.3.5, 1993. URL: http://ieeexploreieee.org/stamp/stamp.jsp?tp=&arnumber=225724&isnumber=5890.
Gerhard Busse, Danny Van Hemelnjck, Igor Solodov, Athanasios Anastasopoulos, "Emerging Technologies in NDT", Proceedings of the 2007 4th International Conference of Emerging Technologies in Non-Destructive Testing (ETNTD 4), Taylor & Francis Ltd, 375 p., 2008. URL : https://www.bookdepository.com/Emerging-Technologies-NDT/9780415464765 URL : http://app.knovel.com/hotlink/toc/id:kpETNDTPI1/emerging-technologies/emerging-technologies.
"ROBHOT—Hotline measurement of electrical resistance on power line joints", YouTube, Apr. 23, 2012. URL vidéo : https://www.youtube.com/watch?v=SFkDdyuJAIg URL : http://www.inspectionsweden.se/.
J. Ormin, J. Bartsch, "Hotline inspection and control of joints", Proc. of 37th International Conference on Large High Voltage Electric Systems (CIGRE'98), Session 1998, 22-203, 7 pp., 1998.
Hastings Catalog, Hot line tools & equipment, 222 p. URL : http://www.hfgp.com/fb-catalog/#501.
"HVA-2000 High Voltage Digital Ammeter", HD Electric Company. URL : http://www.hdelectriccompany.com/hd-electric-products/etm/High-Voltage-Ammeters/high-voltage-digital-ammeter-hva-2000.htm URL brochure : http://www.hdelectriccompany.com/assets/files/HVA-2000-High-Voltage-Ammeter-Literature.pdf.
"HALO®", HD Electric Company. URL : http://www.hdelectriccompany.com/hd-electric-products/etm/High-Voltage-Ammeters/halo-series.htm URL brochure : http://www.hdelectriccompany.com/assets/files/HALO-Ammeters-Literature.pdf.
"GF2011-Portable wireless high voltage primary ammeter", Technical Sheet, GFUVE. URL : http://www.gfuve.com/upfile/pdf/GF2011-Ammeter-Recorder-GFUVE.pdf.
"GF2013-Mid voltage wireless primary ammeter recorder", Technical Sheet, GFUVE. URL : http://www.gfuve.com/upfile/pdf/GF2013-Ammeter-Recorder-GFUVE.pdf URL vidéo : https://www.youtube.com/watch?feature=player_embedded&v=kkH0uWhyCFE.
"GF2015-Wireless primary current recorder meter", fiche technique, GFUVE. URL : http://www.gfuve.com/upfile/pdf/GF2015-Ammeter-Recorder-GFUVE.pdf URL vidéo : https://www.youtube.com/watch?feature=player_embedded&v=sNJJRYXstWw.
"GF2018-High voltage wireless primary current sensor", Technical Sheet, GFUVE. URL : http://www.gfuve.com/upfile/pdf/GF2018-Ammeter-Recorder-GFUVE.pdf.
"Wireless Current Meter", site web ENTEC. URL : http://www.entecene.co.kr/eng/products/power0706.html.
"UT255 Series High Voltage Clamp Ammeters", site web UNI-T. URL : http://www.uni-trend.com/en/product/2014_0731_852.html (UT255A) http://www.uni-trend.com/en/product/2014_0731_853.html (UT255B).
"H/L Voltage Clamp Meter", site web ETCR. URL : http://www.gz-etcr.com/productID/plistone-3088689-1.html.
"High voltage clamps PI-23", Technical Sheet, Circutor. URL : http://circutor.com/docs/FT_M8_PI_EN.pdf.
"Overhead line testing equipment", site web Megger. URL : http://en.meggercom/products/cable-fault-and- diagnostics/cable-testing-and-diagnostics/overhead-line-testing-equipment URL brochure : https://portalvhds963slh4m3fqg2.blob.core.windows.net/megger-products/MDP_DS_en_V02_pdf.
Anonymous, "Overhead Transmission Lines Resistance Measurement of Joints—Technical Guideline", Svenska Kraftnat, Swedish National Grid, Apr. 29, 2015, pp. 1-17, XP055497450, URL:https://

(56) References Cited

OTHER PUBLICATIONS www.svk.se/siteassets/aktorsportalen/tekniska-riktlinjer/tr05/tr05-16e_150429.pdf [retrieved on Aug. 6, 2018], p. 7-p. 11.
Supplementary European Search Report, EP17857726, Munich, dated May 5, 2020.

* cited by examiner

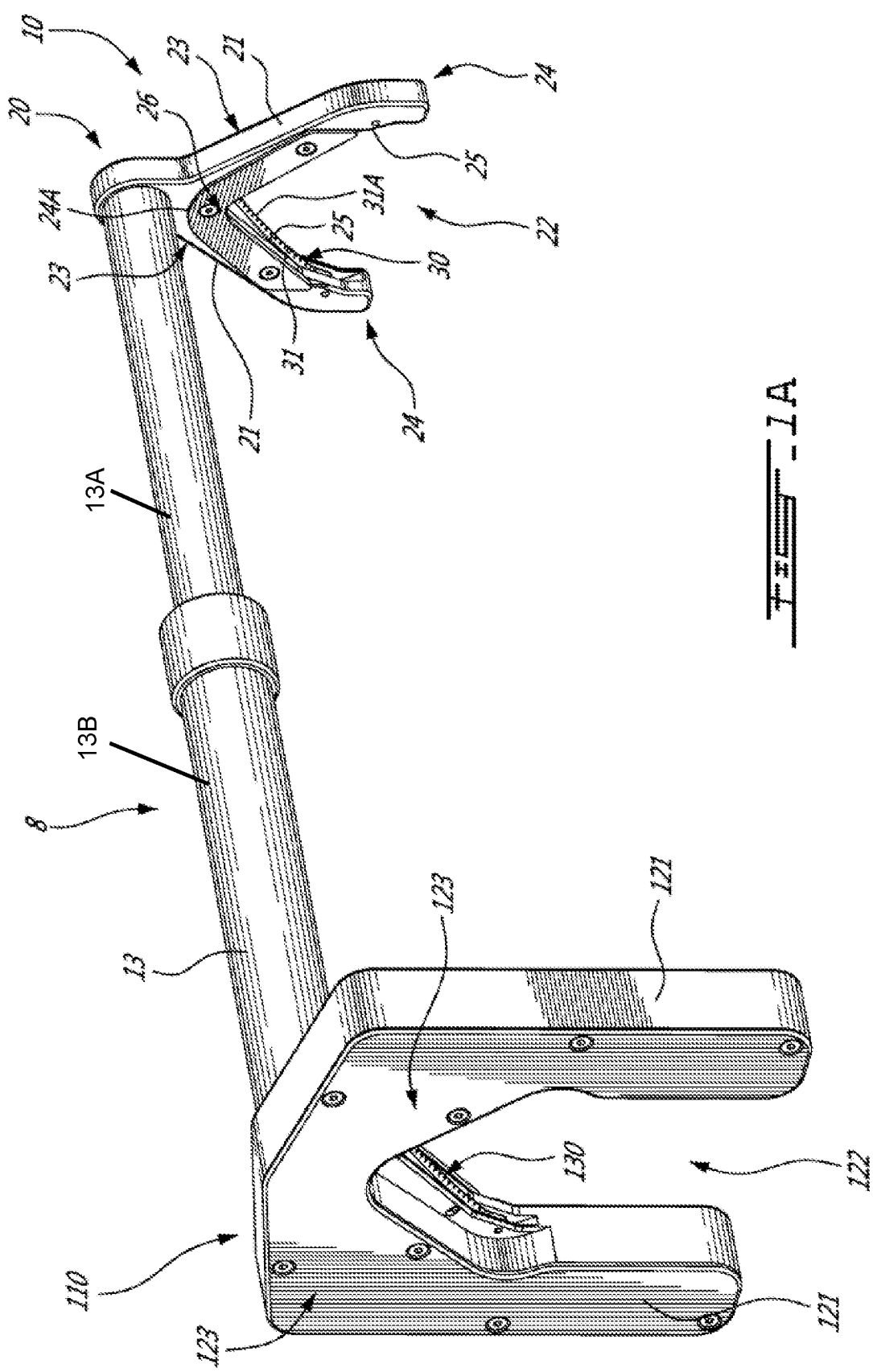

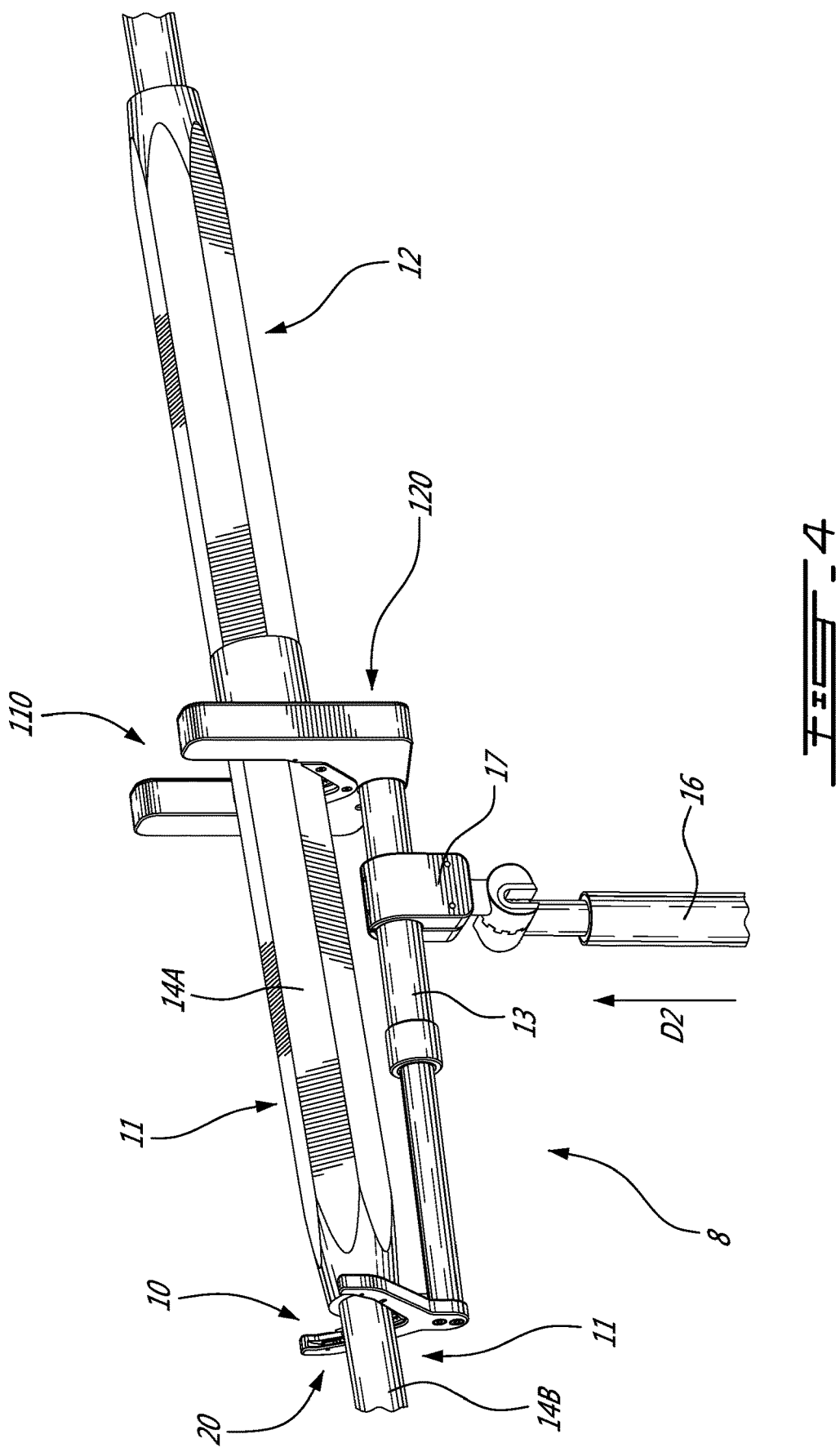

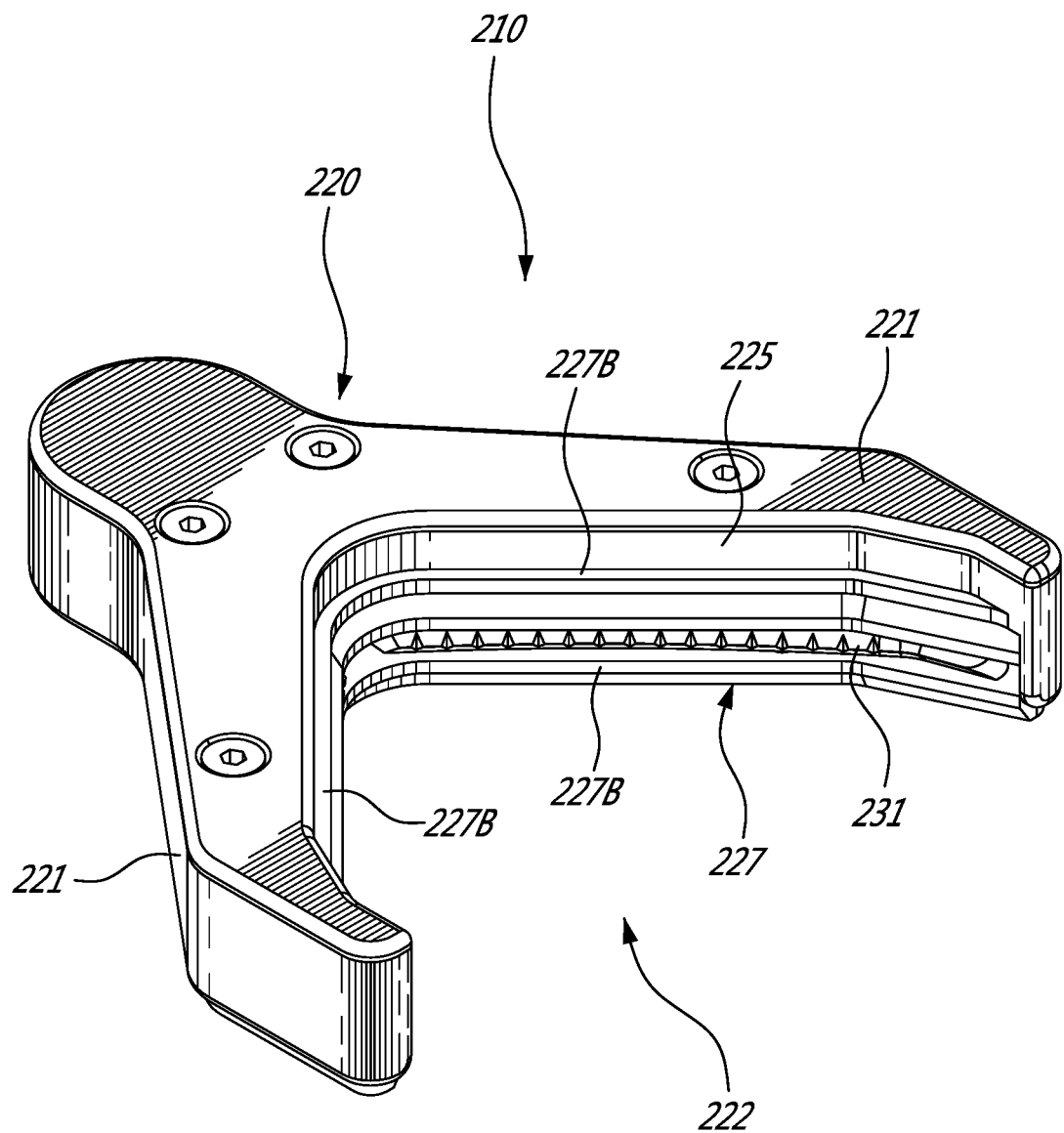

RESISTANCE-MEASURING DEVICE AND METHOD

CROSS-REFERENCE TO RELATED APPLICATIONS

This application is a 371 application of International application No. PCT/CA2017/051157 filed Sep. 29, 2017, which claims the priority of U.S. provisional patent application 62/404,376 filed Oct. 5, 2016, the entire contents of each of which are incorporated by reference herein.

TECHNICAL FIELD

The application relates generally to electrical power lines and, more particularly, to a device and method for measuring the electrical resistance of components of same.

BACKGROUND

It is sometimes necessary to inspect or monitor the components of electric power lines. One such component is a connector of the electric line. It is understood that the electrical resistance of the connector is a good indicator of the state of its degradation, and can provide information about the remainder of its useful life. Some conventional tools directly measure the resistance of the connector with a micro-ohm meter applied directly onto the energised electric line.

It is also known that the accuracy and reliability of measurements of the electrical resistance of the component can be improved when there is a clean and direct electrical contact between the measurement tool and the connector. This often requires manually cleaning or clearing the surface of the component prior to applying the measuring tool. However, manually cleaning or clearing the component is difficult to do when the operator is located at a distance from the component, as is the case with aerial power lines.

SUMMARY

In one aspect, there is provided a resistance-measuring device mountable to a component of a current-carrying transmission line, the resistance-measuring device comprising: a body having a base and two arms with interconnected first ends and spaced-apart second ends, the arms defining a gap therebetween, each arm having an inner portion facing the gap, the body being displaceable to mount the body about the component and position the component within the gap, the body having an abrading mechanism mounted to the arms, the abrading mechanism having an electrically-conductive abrading element disposed along the arm and facing inwardly toward the gap, the abrading element rubbing against an outer surface of the component upon displacing the body to mount the body about the component.

In an embodiment, the abrading mechanism has a biasing element mounted to the arm and operable to bias the abrading element into the gap.

In an embodiment, the body has a movement limiter, the movement limiter being fixedly mounted to one of the arms of the body and having an inner edge extending past the inner portion of the arm and into the gap.

In an embodiment, the movement limiter is made from an electrically-insulating material.

In an embodiment, each arm has an internal cavity and an opening along the inner portion, the abrading element being disposed within the cavity, the abrading element being displaceable to emerge from the cavity through the opening and into the gap.

In an embodiment, the abrading element extends between first and second ends, a first end of the abrading element being mounted to a pivot on the arm, and a second end of the abrading element being free to turn about the pivot into the gap.

In an embodiment, the abrading mechanism has a biasing element mounted to the arm and to the abrading element, the biasing element being operable to bias the second end of the abrading element about the pivot and into the gap.

In an embodiment, at least one of the abrading elements of the body has an inner serrated edge.

In an embodiment, a width of the gap between the arms varies between the first and second ends of the arms.

In an embodiment, the width of the gap decreases from the second ends of the arms to the first ends of the arms.

In an embodiment, the width of the gap is greatest between the second ends of the arms.

In an embodiment, the width of the gap is greatest between the first ends of the arms.

In an embodiment, the arms of the body are oriented in a "V".

In an embodiment, the arms of the body are oriented in a "U".

In an embodiment, the gap between the arms has a mushroom-head shape adjacent to the first ends of the arms.

An apparatus for measuring resistance of components of a current-carrying transmission line includes at least of the resistance-measuring devices disclosed herein. A first device is mountable to a first component of the current-carrying transmission line, and a second device is mountable to a second component of the current-carrying transmission line. The bodies of the first and second devices are connected with an elongated member.

In an embodiment, the elongated member of the apparatus is telescopic to vary a distance separating the bodies of the first and second devices.

In another aspect, there is provided a method of measuring an electrical resistance of a component of a current-carrying transmission line, comprising: positioning the component in a central aperture of a device for measuring the electrical resistance, the central aperture being at least partially delimited by at least one abrading element facing inwardly toward the central aperture; displacing the device to rub the at least one abrading element against an outer surface of the component within the central aperture; and measuring the electrical resistance of the component with the device.

In an embodiment, the method further includes biasing the at least one abrading element into the central aperture.

In an embodiment, displacing the device includes displacing the device until the outer surface of the component abuts against an electrically-insulating movement limiter extending into the central aperture.

In an embodiment, displacing the device until the outer surface of the component abuts against the movement limiter includes abutting only the movement limiter and the at least one abrading element of the device against the outer surface of the component.

In an embodiment, displacing the device includes centering the component within the central aperture.

In an embodiment, displacing the device includes causing the at least one abrading element to displace while rubbing against the outer surface of the component.

In an embodiment, positioning the component includes positioning another component of the current-carrying transmission line in a central aperture of a second device for measuring the electrical resistance, the device and the second device being connected by an elongated member.

In an embodiment, positioning another component includes varying a distance separating the device and the second device with the elongated member.

In an embodiment, displacing the device includes displacing the device to rub the at least one abrading element against the outer surface of the component from below the component.

DESCRIPTION OF THE DRAWINGS

Reference is now made to the accompanying figures in which:

FIG. 1A is a perspective view of an apparatus for measuring resistance of components of a current-carrying transmission line, according to an embodiment of the present disclosure;

FIG. 4 is a perspective view of the devices of FIG. 1B being mounted to the components of the current-carrying transmission line from below with a pole; and FIG. 5 is a perspective view of a resistance-measuring device, according to another embodiment of the present disclosure.

DETAILED DESCRIPTION

Figure 1B:
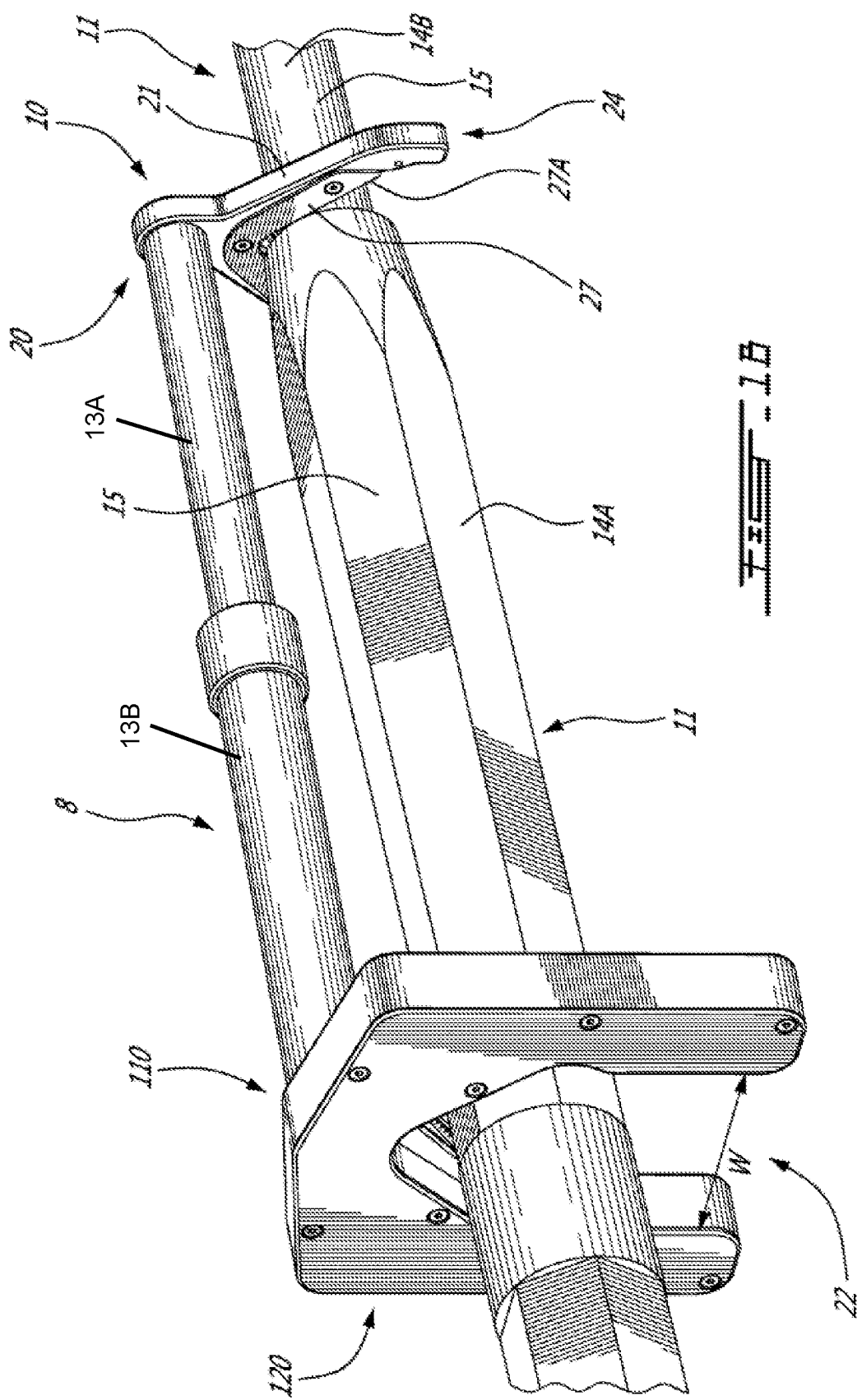
FIG. 1B is another perspective view of the apparatus of FIG. 1A, resistance-measuring devices of the apparatus being supported by the components of the current-carrying transmission line.
Figure 1C:
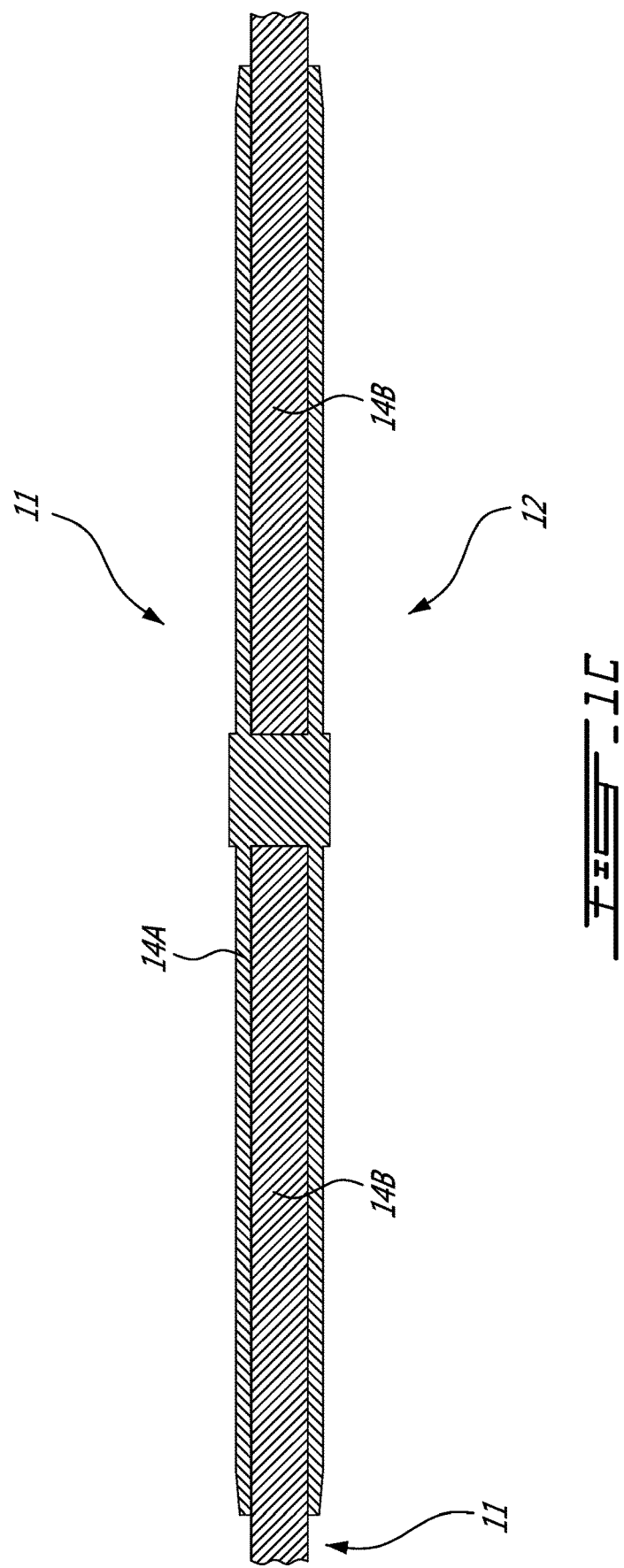
FIG. 1C is a side cross-sectional view of the components and the current-carrying transmission line of FIG. 1B.

FIGS. 1A to 1C illustrate an apparatus 8 for measuring the electrical resistance of components 11 of a current-carrying transmission line 12. The apparatus 8 has two resistance-measuring devices 10,110, each of which is used for measuring the electrical resistance of one of the components 11 of the electrical current-carrying transmission line 12. The resistance-measuring devices 10,110 (sometimes simply referred to herein as "devices 10,110") in FIG. 1B are supported by the aerial current-carrying transmission line 12 (sometimes referred to herein as simply "transmission line 12"). As will be explained in greater detail below, the devices 10,110 generate a direct electrical contact with the component 11 so that the electrical resistance of the component 11 can be measured by the devices 10,110. The devices 10,110 therefore contribute to the inspection, monitoring, and maintenance of components 11 of transmission lines 12.

In the depicted embodiment, the devices 10,110 are connected with an elongated member 13 to form the apparatus 8. The elongated member 13 is telescopic, and has an inner tubular member 13A being displaceable within and relative to an outer tubular member 13B. The inner and outer tubular members 13A,13B are displaceable with respect to one another to vary the distance separating the devices 10,110, to increase or decrease this distance. The elongated member 13 can have wires, rods, or other linkages to provide an electrical connection between the devices 10,110. The elongated member 13 can also have a processor to measure the electrical resistance with the devices 10,110, and to wirelessly communicated the measured electrical resistance of the components 11.

In an alternate embodiment, one or both of the devices 10,110 is used alone, i.e. without the apparatus 8, as shown in FIG. 5. Similarly, in an alternate embodiment, the apparatus 8 has more than two devices 10,110. It will therefore be appreciated that the configuration or number of devices 10,110 is not limited to the depicted embodiment.

Still referring to FIGS. 1A to 1C, the electrical resistance of the component 11 is determined by knowing or measuring the amperage in the transmission line 12 and then measuring the voltage drop due to the resistance of the component 11 being tested. Features of the devices 10,110 directly engage and abut against the component 11. It will be appreciated that the electrical resistance of the component 11, typically expressed in ohm (0), is a measure of the difficulty to pass an electric current through that component 11. If the component 11 generates greater electrical resistance, it may be indicative that the component 11 is physically damaged, and thus requires further inspection, repair, or replacement. The electrical resistance of the component 11 can also be used as a proxy for the state of physical degradation of the component 11.

In FIG. 1B, the component 11 to be monitored by the device 110 is a sleeve or connector 14A, whereas the component 11 to be monitored by the device 10 is the current-carrying conductor 14B. The connector 14A is mounted about the conductor 14B, and helps to connect together two different conductors 14B, as shown in FIG. 1C. It will be appreciated that the devices 10,110 disclosed herein can be used to inspect other energized components 11 of the transmission line 12, including, but not limited to, connectors, splices, switching devices, mid-span or dead-end sleeves joining two segments of transmission line 12, spacers that maintain the right distances between adjacent transmission lines 12, or parts of the cable or strands making up the conductor 14B itself. The devices 10,110 can therefore be mounted on various configurations of transmission line 12, including but not limited to, single conductor, overhead ground wire, or bundles of two, three, four, or more conductors. Similarly, the devices 10,100 can be used to also measure the electrical resistance of the contact between the connector 14A and the conductor 14B. The electrical resistance of the contact between the connector 14A and the conductor 14B can vary as these components 11 age.

In FIG. 1B, the transmission line 12 is elevated from a ground surface. Line technicians are therefore raised from the ground surface, or climb upward, to position themselves in proximity to the component 11 in order to position the devices 10,110. The devices 10,110 are removably mounted to the connector 14A and to the conductor 14B.

The devices 10,110 each include a body 20,120 which provides the corpus of each device 10,110 and structure thereto, and abrading mechanisms 30,130. The body 20 and abrading mechanisms 30 of the device 10 will now be described in greater detail, it being appreciated that the body 120 and the abrading mechanisms 130 of the device 110 will have similar components and features. Any distinctions between the body 20 and body 120, and between abrading mechanism 30 and abrading mechanism 130, will be explained below.

Referring to FIG. 1A, the body 20 has two arms 21 which define an aperture or gap 22 between the arms 21 for receiving the conductor 14B. More particularly, the arms 21 are connected to one another at a proximal, first end 23 of each arm 21, and are spaced-apart from each other at a distal, second end 24 of each arm 21. In the depicted embodiment, the first ends 23 of each arm 21 are interconnected via a common portion 24A of the body 20, and it will be appreciated that the first ends 23 can also be interconnected in other ways. When the body 20 is displaced to be mounted about the conductor 14B, the conductor 14B first enters the gap 22 via the second ends 24 of the arms 21.

Each arm 21 has an inner portion 25 facing the gap 22. The inner portion 25 can be a surface, edge, or other segment of each arm 21 that faces the gap 22. The device 10 is mounted about the conductor 14B by displacing the body 20 in order to position the conductor 14B between the arms 21 and within the gap 22. The displacement of the body 20 is typically, but not exclusively, performed manually by the line technician in proximity to the conductor 14B to be inspected. When the body 20 is displaced in this manner, the conductor 14B enters the gap 22 via the second ends 24 of the arms 21, and travels towards the first ends 23 of the arms 21.

Still referring to FIGS. 1A and 1B, the body 20 and the arms 21 have a "V"-shape. Each arm 21 extends away from the other arm 21 such that the gap 22 between the arms 21 is widest at the distal, second ends 24. Conversely, the gap 22 narrows towards an apex 26 defined at the point where the first ends 23 of both arms 21 meet. The V-shape of the arms 21 helps to guide the conductor 14B toward the apex 26 when the body 20 is displaced to mount the device 10, which facilitates a good electrical contact of the abrading mechanisms 30 with the conductor 14B. The V-shape of the arms 21 therefore helps to center the conductor 14B between the arms 21. The body 120 of device 110 and the arms 121 have a "U"-shape. Each arm 121 is shaped and spaced from the other arm 121 such that the gap 122 between the arms 121 has a substantially "mushroom-head" shape adjacent to the first ends 123. The gap 122 is thus widest between the proximal, first ends 123 of the arms 121. The widening of the gap 122 at the first ends 123 may allow for better engagement of the body 120 with a wider component, such as the connector 14A of FIG. 1B. It can thus be appreciated that a width W of the gap 22, which is a measurement of the distance between the arms 21,121, varies along the length of the arms 21,121.

The abrading mechanisms 30 are associated with the arms 21. More particularly, each abrading mechanism 30, or components thereof, is mounted to the inner portion 25 of each arm 21. Each abrading mechanism 30 engages the conductor 14B as the body 20 is displaced, and establishes direct electrical contact with the conductor 14B. This facilitates measuring the electrical resistance of the conductor 14B.

Each abrading mechanism 30 has an electrically-conductive abrading element 31 which faces inwardly toward the gap 22 and extends along some or all of the length of the each arm 21. In having a given length or extent, the abrading element 31 provides a distance over which abrading operations can occur. By "electrically conductive", it will be appreciated that the abrading element 31 conducts electrical current therethrough in order to facilitate the measurement of the resistance of the conductor 14B. The electrical conductivity of the abrading element 31 can be obtained from the material from which it is manufactured, for example.

The abrading element 31 rubs, scrapes, wears down, or otherwise abrades against an outer surface 15 of the conductor 14B as the body 20 is displaced to mount the device 10 about the conductor 14B. In so doing, the abrading element 31 removes or reduces from the outer surface 15 the presence of dirt, oxidation, corrosion, chemicals, and other materials that are present on the outer surface 15 of the conductor 14B. These materials may prevent or inhibit obtaining an accurate measurement of the electrical resistance of the conductor 14B, and thus prevent or inhibit obtaining an accurate assessment of its physical state. By removing these materials or reducing their presence on the outer surface 15 of the conductor 14B, each abrading element 31 contributes to improving the accuracy of the measurement of electrical resistance, and thus contributes to improving the assessment of the state of wear or degradation of the conductor 14B. When the materials are removed from the outer surface 15, or their presence reduced, the abrading element 31 forms an improved direct electrical contact with the outer surface 15.

It can thus be appreciated that the abrading mechanism 30 and the abrading element 31 can take any suitable form to accomplish the above-described functionality. Still referring to FIG. 1A, the abrading element 31 includes a metal blade with an inner serrated edge 31A of the blade. The serrations 31B of the edge 31A rub against the outer surface 15 of the conductor 14B as the body 20 is displaced to mount the device 10 about the conductor 14B. In an alternate embodiment, the abrading element 31 includes a metallic bristle body with metallic bristles for rubbing against the outer surface 15 when the body 20 is displaced. In another alternate embodiment, the abrading element 31 includes a metallic body with a metallic coil or winding for rubbing against the outer surface 15 when the body 20 is displaced. Similarly, although shown herein and described as two abrading mechanisms 30 and abrading elements 31, it will be appreciated the abrading mechanism 30 and/or abrading elements 31 can be a single body disposed on both arms 21.

Figure 2A:
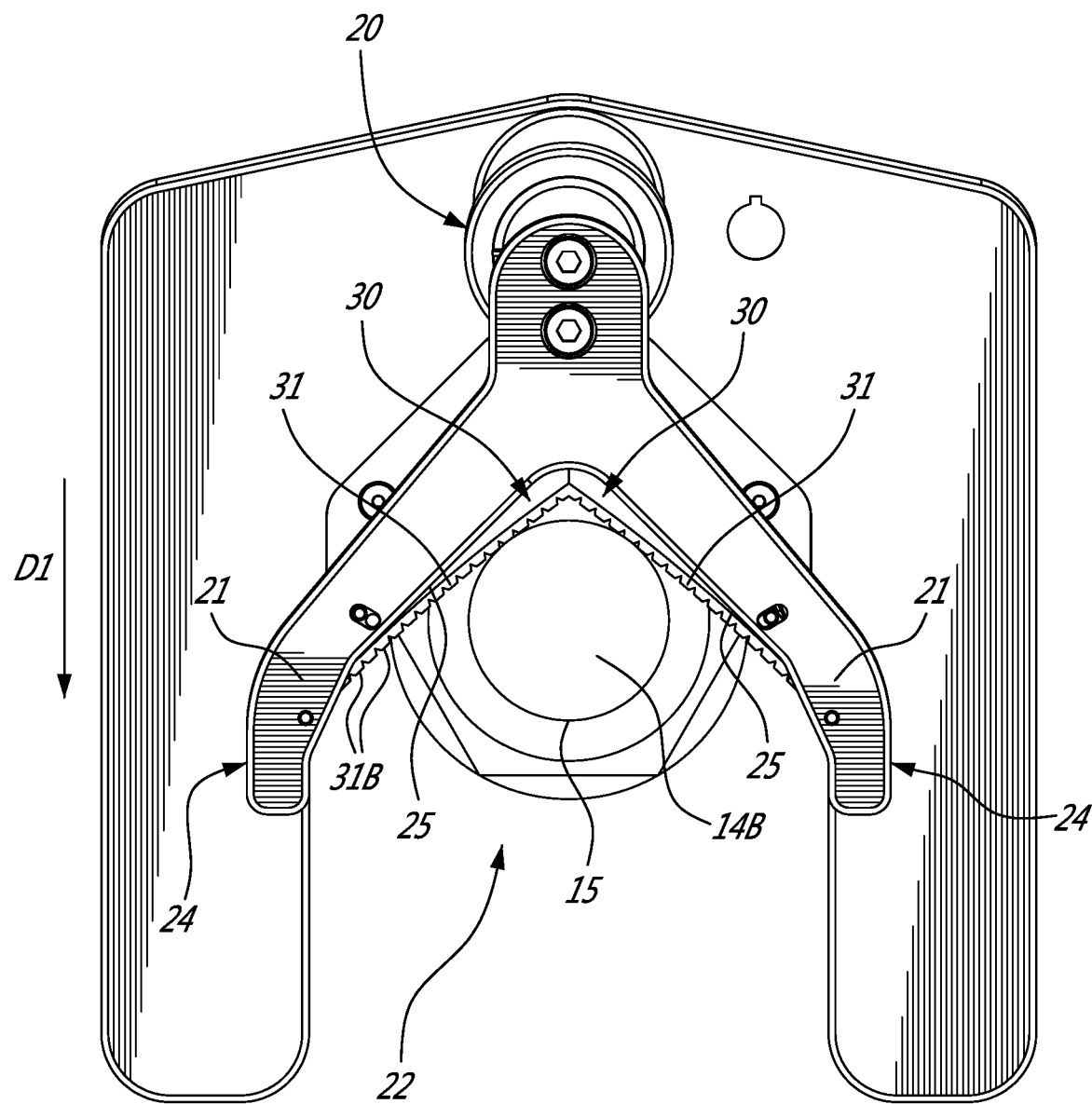
FIG. 2A is an end view of one of the devices of FIG. 1B being lowered onto one of the components of the current-carrying transmission line.
Figure 2B:
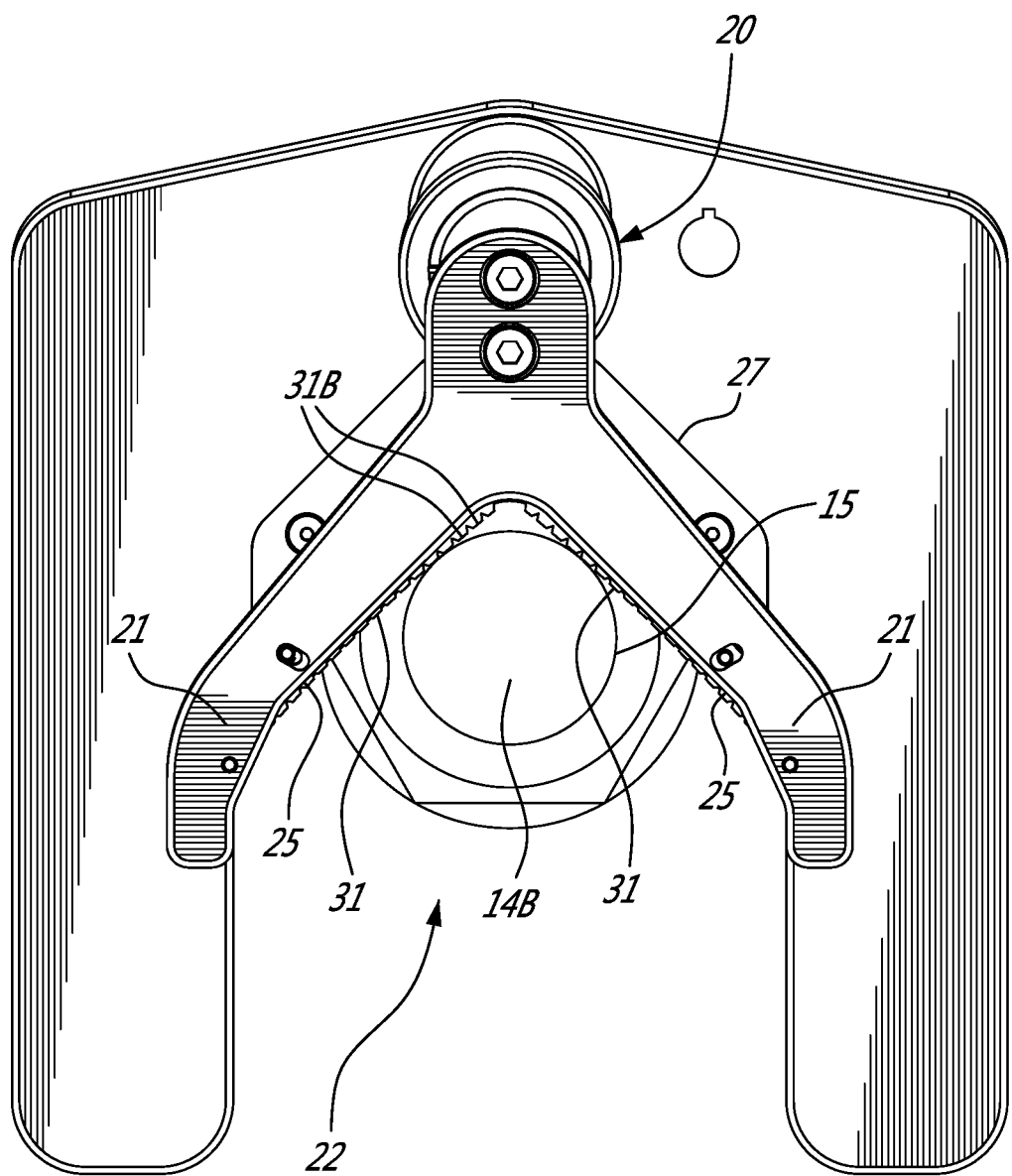
FIG. 2B is another end view of one of the devices of FIG. 1B being further lowered onto the component.

The displacement of the body 20 and the rubbing of the abrading elements 31 is described in further detail with reference to FIGS. 2A and 2B. The body 20 is displaced in direction D1. In the depicted embodiment, direction D1 is downward because the body 20 is mounted to the conductor 14B from above. The body 20 may also be mounted onto the conductor 14B from below, as will be described in greater detail below. Referring to FIG. 2A, the body 20 is lowered along direction D1 such that the conductor 14B enters the gap 22 via the second ends 24 of the arms 21. The serrations 31B of the edge 31A eventually abut against the outer surface 15 of the conductor 14B. As the body 20 continues its displacement along direction D1, the serrations 31B of the serrated edge 31A are also displaced relative to the outer surface 15, thereby rubbing against the outer surface 15 and removing materials therefrom. Eventually, the abrading elements 31 come to a rest on the conductor 14B and are supported thereby, as shown in FIG. 2B, such that the serrations 31B no longer rub against the outer surface 15. In this rested position, the abrading elements 31 form a direct electrical contact with the cleaned outer surface 15, thereby facilitating the measurement of the electrical resistance of the conductor 14B. In the depicted embodiment, the abrading element 31 is housed within the arms and supported by a biasing mechanism, as will be described in greater detail below. It will be appreciated that the abrading elements 31 may not be biased, and may instead be fixed in position on the inner portions 25 of the arms 21.

In the depicted embodiment, the body 20 has a movement limiter 27. The movement limiter 27 prevents the further displacement of the body 20 along direction D1. More particularly, the movement limiter 27 prevents the arms 21 and other portions of the body 20 from entering into contact with the outer surface 15 of the conductor 14B, thereby helping to ensure that only the abrading elements 31 and the movement limiter 27 are in contact with the outer surface 15. The movement limiter 27 is fixedly mounted to one or more of the arms 21, and does not move with respect to the arms 21. The movement limiter 27 has an inner edge 27A (see FIG. 1B) or portion that extends into the gap 22 more than the inner portion 25 of each arm 21 so that the outer surface 15 of the conductor 14B engages the edge of the movement limiter 27 before the outer surface 15 reaches the inner portions 25 of the arms 21. The movement limiter 27 is made from an electrically-insulating material to prevent a conductive contact from being formed with the conductor 14B. It will be appreciated that the movement limiter 27 can take any suitable shape to achieve the above-described functionality. In the depicted embodiment, the movement limiter 27 is in the form of a "V", with a wing extending along each arm 21 of the body 20.

An embodiment of the abrading mechanisms 30 is now described with reference to FIGS. 3A and 3B. Each arm 21 includes a cavity 28 therein into which the abrading mechanism 30 is received. The inner portion 25 of each arm 21 also has a slit or elongated opening 29 leading to the cavity 28 through which the abrading element 31 emerges and returns to the cavity 28. A distal end of each abrading mechanism 30, in proximity to the second end 24 of each arm 21, is mounted about a pivot 32. The pivotable mounting of each abrading mechanism 30 allows it to pivot within the cavity 28 about an axis defined by the pivot 32. A force-application assembly, which includes a biasing element 33 in each arm 21, engages the abrading mechanism 30 and biases it outwardly toward the gap 22. The pivot 32 and the biasing element 33 help to control the force applied to the outer surface 15 of the conductor 14B, and define a default position for the abrading element 31 whereby it is disposed outside of each arm 21 and within the gap 22. By controlling the force applied by the abrading elements 31 to the outer surface 15 of the conductor 14B, the biasing element 33 helps to reduce damage being caused to the conductor 14B and allows a relatively constant force to be applied.

Figure 3A:
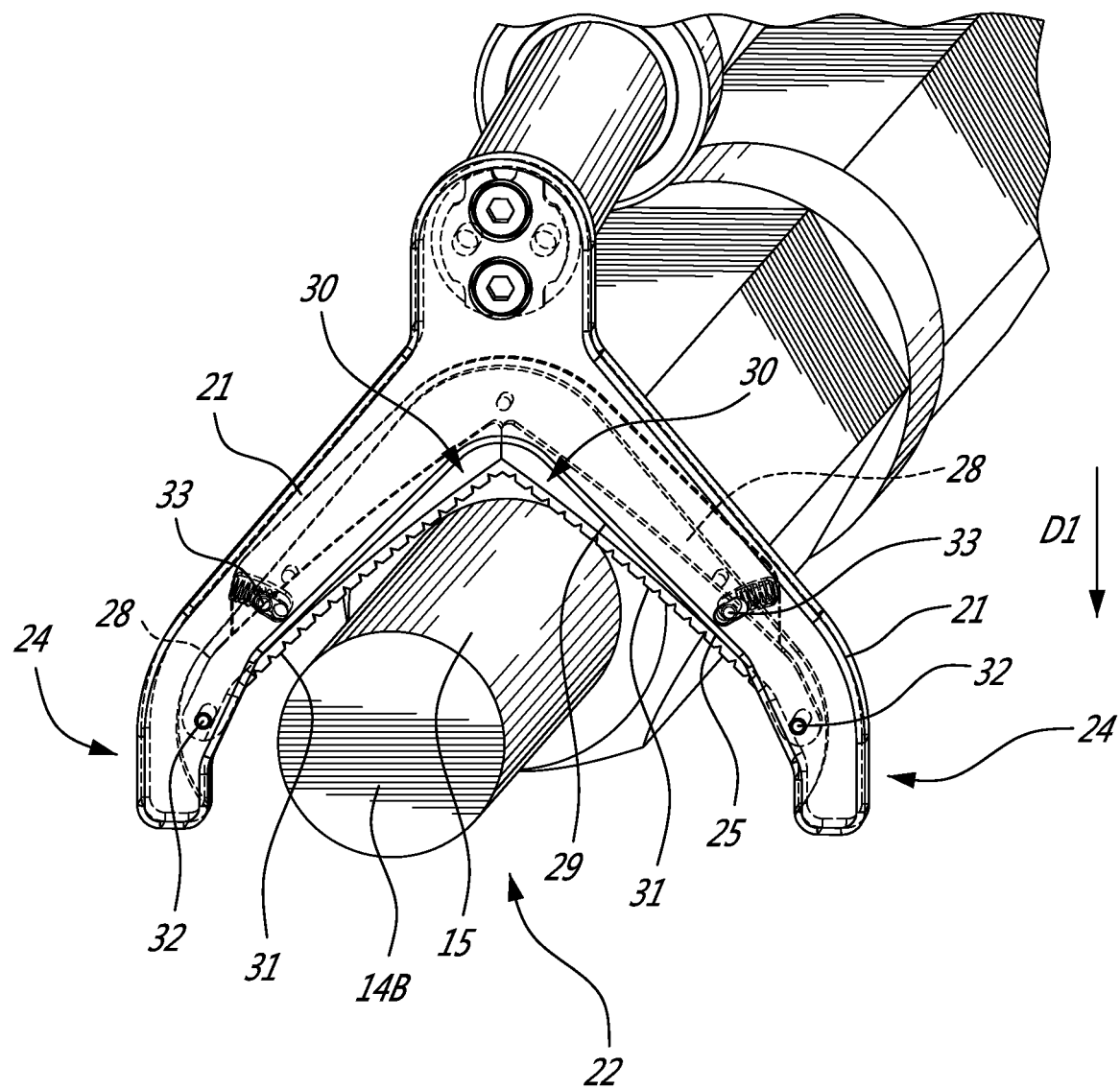
FIG. 3A is a perspective view of one of the devices of FIG. 1B being lowered onto one of the components of the current-carrying transmission line, the device being partially transparent to show internal components thereof.
Figure 3B:
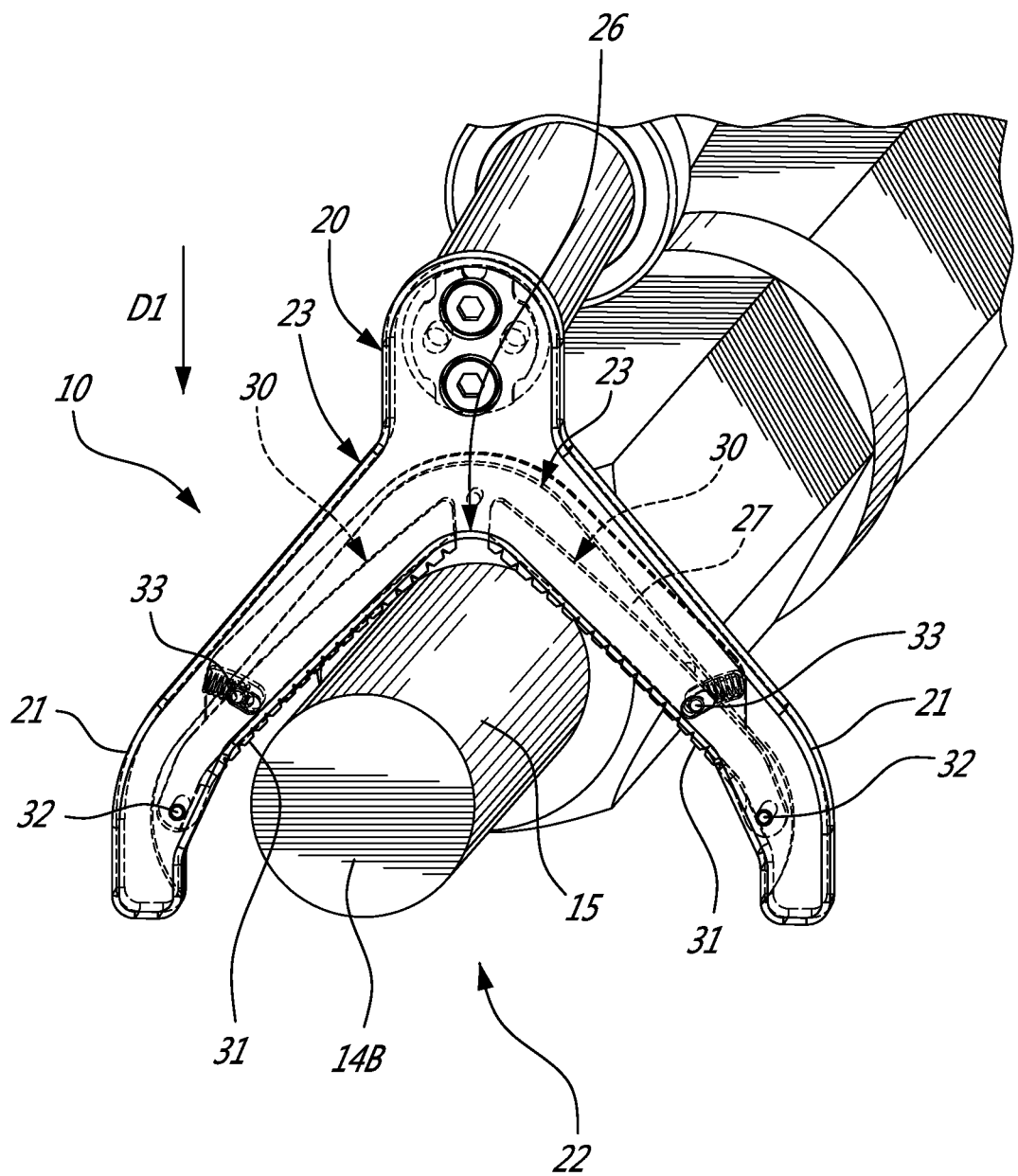
FIG. 3B is another perspective view of one of the devices of FIG. 1B being further lowered onto the component, the device being partially transparent to show internal components thereof.

The operation of the abrading mechanisms 30 of FIGS. 3A and 3B is as follows. As the body 20 is being displaced in direction D1 toward the conductor 14B, the abrading elements 31 are in their default position because the biasing elements 33 are biasing the abrading mechanisms 30 toward the gap 22, as shown in FIG. 3A. As the body 20 is further displaced in direction D1, the abrading elements 31 come into contact with the outer surface 15, as shown in FIG. 3B. The body 20 continues to displace and causes the conductor 14B to direct itself toward the first ends 23 of the arms 21 and their apex 26. The conductor 14B is thus channelled by the arms 21 with the movement of the body 20 to a narrower point in the gap 22, which causes the conductor 14B to push against the abrading elements 31. This allows the abrading elements 31 to rub against the outer surface 15. The contact of the outer surface 15 with the abrading elements 31 applies a force to the abrading elements 31 which push back against the biasing members 33 and turn around pivot 32. The pivotal displacement of the abrading mechanisms 30 may increase the length of the abrading elements 31 that rub against the outer surface 15, which contributes to improving the direct electrical contact of the abrading elements 31 with the conductor 14B. The movement limiter 27 and its inner edge 27A eventually limit further displacement of the body 20, such that the abrading elements 31 and the inner edge 27A are the only portion of the device 10 in direct contact with the outer surface 15 of the conductor 14B. The movement limiter 27 therefore limits a maximum displacement of the body 20, and guides the component 11 toward the apex 26 during displacement of the body 20. The movement limiter 27, when used in combination with the biasing element 33, helps to limit the application of a biasing force to the abrading elements 31.

FIG. 4 shows the devices 10,110 of the apparatus 8 being mounted to the conductor 14B and to the connector 14A from below. The apparatus 8 in the depicted embodiment has a pole 16 mounted to the elongated member 13. In the depicted embodiment, the bodies 20,120 of the devices 10,110 are hoisted by the pole 16 and displaced along direction D2 to mount or engage the devices 10,110 with the conductor 14B and the connector 14A. It can thus be appreciated that the devices 10,110 can engage the conductor 14B and/or the connector 14A from any suitable direction. The pole 16 has a bracket 17 which engages and supports the telescopic member 13. The other end of the pole 16 is manually operated by the line technician who is located a distance away from the transmission line 12. In the depicted embodiment, the positioning of the devices 10,110 onto the respective conductor 14B and connector 14A forms a good electrical contact between the devices 10,110 and the conductor 14B and the connector 14A. The devices 10,110 can therefore be used to measure the electrical resistance of the contact between the connector 14A and the conductor 14B. The electrical resistance of the contact between the connector 14A and the conductor 14B can vary as these components 11 age, such that the measured electrical resistance provides a suitable proxy for the wear or physical degradation of one or both of these components 11.

FIG. 5 shows another embodiment of the device 210. The device 210 operates similarly to the device 10,110, and has similar components. Therefore, the above description of the devices 10,110 applies mutatis mutandis to the device 210. The abrading elements 231 of the device 210 are housed within the arms 221. In the depicted embodiment, the movement limiter 227 includes multiple protruding ridges 227B. Each ridge 227B extends outwardly from the inner portion 225 of each arm 221 and into the gap 222. The ridges 227B help to electrically isolate the abrading elements 231, such that the abrading elements 231 and the ridges 227B are the only portion of the device 210 in direct contact with the outer surface 15 of the conductor 14B. The movement limiter 227 therefore limits a maximum displacement of the body 220. The ridges 227B are made from an electrically-insulating material, such as plastic.

The devices 10,110,210 disclosed herein can be used on their own to measure the electrical resistance of the conductor 14B, or in conjunction with another ohm-meter or tool which measures the electrical resistance.

It can thus be appreciated that the devices 10,110,210 disclosed herein, in at least some of the embodiments thereof, provide a tool for abrading the outer surface 15 of component 11 with a controlled force. By rubbing and cleaning the outer surface 15 of the component 11 when mounting the device 10,110,210, the device 10,110,210 helps to provide a better electrical contact between itself and the component 11.

The device 10,110,210 also eliminates or reduces the need for a separate cleaning or abrading operation to be performed before measuring the electrical resistance, as is the case with certain conventional tools. This separate cleaning operation is time consuming, and difficult to perform for the line technician who is often located at a distance from the component 11 to be analysed. The device 10,110,210 therefore provides a single tool which can be used for both cleaning the outer surface 15 of the component 11, and for measuring its electrical resistance.

Referring to FIGS. 1A to 1C, there is also disclosed a method of measuring an electrical resistance of the component 11 of the current-carrying transmission line 12. The method includes positioning the component 11 in a central aperture or gap 22 of the device 10 for measuring the electrical resistance. The central aperture 22 is at least partially delimited by at least one abrading element 31 facing inwardly toward the central aperture 22. The method includes displacing the device 10 to rub the at least one abrading element 31 against the outer surface 15 of the component 11 within the central aperture 22. The method also includes measuring the electrical resistance of the component 11 with the device 10.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure, and such modifications are intended to fall within the appended claims.

The invention claimed is:

1. A resistance-measuring device mountable to a component of a current-carrying transmission line, the resistance-measuring device comprising: a body having a base and two arms extending between interconnected first ends and spaced-apart second ends, the arms defining a gap therebetween, each arm having an inner portion facing the gap, the body being displaceable to mount the body about the component and position the component within the gap, the body having an abrading mechanism mounted to the arms and being displaceable relative to the arms, the abrading mechanism having an electrically-conductive abrading element extending along substantially all of a length of the arm defined between the first and second ends and facing inwardly toward the gap, the component displacing the abrading mechanism relative to the arms, and the component caused to displace linearly along the abrading element and relative thereto toward the interconnected first ends of the arms and to rub against the abrading element, upon displacing the body to mount the body about the component.

2. The resistance-measuring device as defined in claim 1, wherein the abrading mechanism has a biasing element mounted to the arm and operable to bias the abrading element into the gap.

3. The resistance-measuring device as defined in claim 1, wherein the body has a movement limiter, the movement limiter being fixedly mounted to one of the arms of the body and having an inner edge extending past the inner portion of the arm and into the gap.

4. The resistance-measuring device as defined in claim 3, wherein the movement limiter is made from an electrically-insulating material.

5. The resistance-measuring device as defined in claim 1, wherein each arm has an internal cavity and an opening along the inner portion, the abrading element being disposed within the cavity, the abrading element being displaceable to emerge from the cavity through the opening and into the gap.

6. The resistance-measuring device as defined in claim 1, wherein the abrading element extends between first and second ends, a first end of the abrading element being mounted to a pivot on the arm, and a second end of the abrading element being free to turn about the pivot into the gap.

7. The resistance-measuring device as defined in claim 6, wherein the abrading mechanism has a biasing element mounted to the arm and to the abrading element, the biasing element being operable to bias the second end of the abrading element about the pivot and into the gap.

8. The resistance-measuring device as defined in claim 1, wherein at least one of the abrading elements of the body has an inner serrated edge.

9. The resistance-measuring device as defined in claim 1, wherein a width of the gap between the arms varies between the first and second ends of the arms.

10. The resistance-measuring device as defined in claim 9, wherein the width of the gap decreases from the second ends of the arms to the first ends of the arms.

11. The resistance-measuring device as defined in claim 9, wherein the width of the gap is greatest between the second ends of the arms.

12. The resistance-measuring device as defined in claim 1, wherein the arms of the body are oriented in a "U".

13. The resistance-measuring device as defined in claim 12, wherein the gap between the arms has a mushroom-head shape adjacent to the first ends of the arms.

14. An apparatus for measuring resistance of components of a current-carrying transmission line, the apparatus comprising: at least two of the resistance-measuring devices as defined in claim 1, a first device being mountable to a first component of the current-carrying transmission line, and a second device being mountable to a second component of the current-carrying transmission line, the bodies of the first and second devices being connected with an elongated member.

15. The apparatus as defined in claim 14, wherein the elongated member is telescopic to vary a distance separating the bodies of the first and second devices.

16. A method of measuring an electrical resistance of a component of a current-carrying transmission line, comprising:
  positioning the component in a central aperture of a device for measuring the electrical resistance, the central aperture being at least partially delimited by at least one abrading element facing inwardly toward the central aperture;
  displacing the device toward the component to cause the component to displace the at least one abrading element relative to the device, and to displace linearly along the at least one abrading element toward one end thereof and thereby rub the at least one abrading element against an outer surface of the component within the central aperture; and
  measuring the electrical resistance of the component with the device.

17. The method as defined in claim 16, further comprising biasing the at least one abrading element into the central aperture.

18. The method as defined in claim 16, wherein displacing the device includes displacing the device until the outer surface of the component abuts against an electrically-insulating movement limiter extending into the central aperture.

19. The method as defined in claim 18, wherein displacing the device until the outer surface of the component abuts against the movement limiter includes abutting only the movement limiter and the at least one abrading element of the device against the outer surface of the component.

20. The method as defined in claim 16, wherein displacing the device includes causing the at least one abrading element to displace while rubbing against the outer surface of the component.

* * * * *